United States Patent
Chung et al.

(10) Patent No.: US 10,755,661 B2
(45) Date of Patent: Aug. 25, 2020

(54) DISPLAY PANEL WITH COMPENSATION CAPACITORS

(71) Applicant: Au Optronics Corporation, Hsinchu (TW)

(72) Inventors: Yueh-Hung Chung, Taipei (TW); Ya-Ling Hsu, New Taipei (TW); Han-Ming Chen, Taichung (TW); Chen-Hsien Liao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/431,738

(22) Filed: Jun. 5, 2019

(65) Prior Publication Data

US 2019/0287476 A1    Sep. 19, 2019

Related U.S. Application Data

(62) Division of application No. 15/149,198, filed on May 9, 2016, now Pat. No. 10,354,606.

(30) Foreign Application Priority Data

May 14, 2015  (TW) .............................. 104115332 A

(51) Int. Cl.
  *G06F 3/038*  (2013.01)
  *G09G 3/36*  (2006.01)
  *H01L 27/12*  (2006.01)

(52) U.S. Cl.
  CPC ......... *G09G 3/3677* (2013.01); *G09G 3/3648* (2013.01); *G09G 3/3688* (2013.01); *H01L 27/124* (2013.01); *H01L 27/1255* (2013.01); *G09G 2300/0426* (2013.01); *G09G 2300/0876* (2013.01); *G09G 2320/0204* (2013.01); *G09G 2320/0247* (2013.01)

(58) Field of Classification Search
  CPC .. G09G 3/3677; G09G 3/3648; G09G 3/3688; H01L 27/1255
  USPC ......................................................... 345/214
  See application file for complete search history.

(56) References Cited

U.S. PATENT DOCUMENTS

| | | | | |
|---|---|---|---|---|
| 2006/0208985 | A1* | 9/2006 | Hwang | G09G 3/3655 345/92 |
| 2008/0180174 | A1* | 7/2008 | Kim | H03F 1/083 330/253 |
| 2013/0321367 | A1* | 12/2013 | Kuwabara | G09G 3/3655 345/205 |

(Continued)

*Primary Examiner* — Jonathan M Blancha
(74) *Attorney, Agent, or Firm* — JCIPRNET

(57) ABSTRACT

A display panel has a display area and a non-display area surrounding the display area, and the display panel includes scan lines, data lines, pixel structures, at least one driving device, capacitor electrode lines, and compensation capacitors. Each pixel structure includes an active device, a pixel electrode, and a storage capacitor. The driving device is located in the non-display area and is electrically connected to the pixel structures. The capacitor electrode lines extend to the display area from the non-display area and are electrically connected to the storage capacitors of the pixel structures. The compensation capacitors are located in the non-display area and between the pixel structures and the driving device. Two ends of each of the compensation capacitor are electrically connected to one of the scan lines and one of the capacitor electrode lines, respectively.

10 Claims, 14 Drawing Sheets

(56) References Cited

U.S. PATENT DOCUMENTS

2014/0022500 A1\* 1/2014 Watanabe ......... G02F 1/136204
 349/138
2015/0041833 A1\* 2/2015 Nimura ............... H01L 27/1214
 257/88

\* cited by examiner

DISPLAY PANEL WITH COMPENSATION CAPACITORS

CROSS-REFERENCE TO RELATED APPLICATION

This application is a divisional application of and claims priority benefit of U.S. patent application Ser. No. 15/149,198, filed on May 9, 2016, now allowed, which claims the priority benefit of Taiwan application serial no. 104115332, filed on May 14, 2015. The entirety of each of the above-mentioned patent applications is hereby incorporated by reference herein and made a part of this specification.

FIELD OF THE INVENTION

The invention relates to a display panel. More particularly, the invention relates to a display panel equipped with compensation capacitors.

DESCRIPTION OF RELATED ART

With the evolution of photo-electronic and semiconductor technologies, flat panel displays (FPDs) have been vigorously developed. Among the FPDs, a liquid crystal display (LCD) has become the mainstream display product due to its advantages of outstanding space utilization efficiency, low power consumption, free radiation, and low electrical field interference.

As known to people having ordinary skill in the art, liquid crystals in the display panel of the LCD are arranged according to the difference between the corresponding pixel voltage and the common voltage (Vcom). Subject to various factors, the voltage level of the common voltage in the display panel may vary. In the event that the common voltage of the display panel is unstable, the difference between the common voltage and the pixel voltage corresponding to the same gray-scale value may be changed. If the common voltage is not uniform, the poor uniformity of the common voltage may result in a flicker in the images, which deteriorates the display performance of the LCD.

Accordingly, how to improve the uniformity of the common voltage has always been an issue to be resolved. At present, one of the common solutions is to use a gate pulse driving signal having a shading waveform or to adjust the amplitude of the shading waveform of a gate driving signal, so as to eliminate the flicker and further ameliorate the display performance of the LCD. However, said method of resolving the issue of the poor uniformity of the common voltage is not very useful.

SUMMARY OF THE INVENTION

The invention is directed to a display panel which is capable of improving uniformity of a common voltage in a LCD panel.

In an embodiment of the invention, a display panel that has a display area and a non-display area surrounding the display area is provided, and the display panel includes a plurality of scan lines, a plurality of data lines, a plurality of pixel structures, at least one driving device, a plurality of capacitor electrode lines, and a plurality of compensation capacitors. The scan lines and the data lines extend to the display area from the non-display area. The pixel structures are located in the display area and electrically connected to the scan lines and the data lines, and each of the pixel structures includes an active device and a pixel electrode electrically connected to the active device. The driving device is located in the non-display area and is electrically connected to the pixel structures. The capacitor electrode lines extend to the display area from the non-display area and are electrically connected to the storage capacitors of the pixel structures. The compensation capacitors are located in the non-display area and between the pixel structures and the driving device. One end of each of the compensation capacitors is electrically connected to one of the scan lines, and the other end of each of the compensation capacitors is electrically connected to one of the capacitor electrode lines. The scan lines and the capacitor electrode lines are in one film layer, and each of the compensation capacitors is overlapped with a respective one of one of the scan lines or one of the capacitor electrode lines along a stacking direction of the data lines and the scan lines.

In view of the above, the arrangement of the compensation capacitors in the non-display area of the display panel leads to the improved uniformity of the common voltage of the display panel. Besides, the uniformity of the common voltage lessens the flicker in the images displayed on the display panel, and the display performance of the display panel is also improved.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
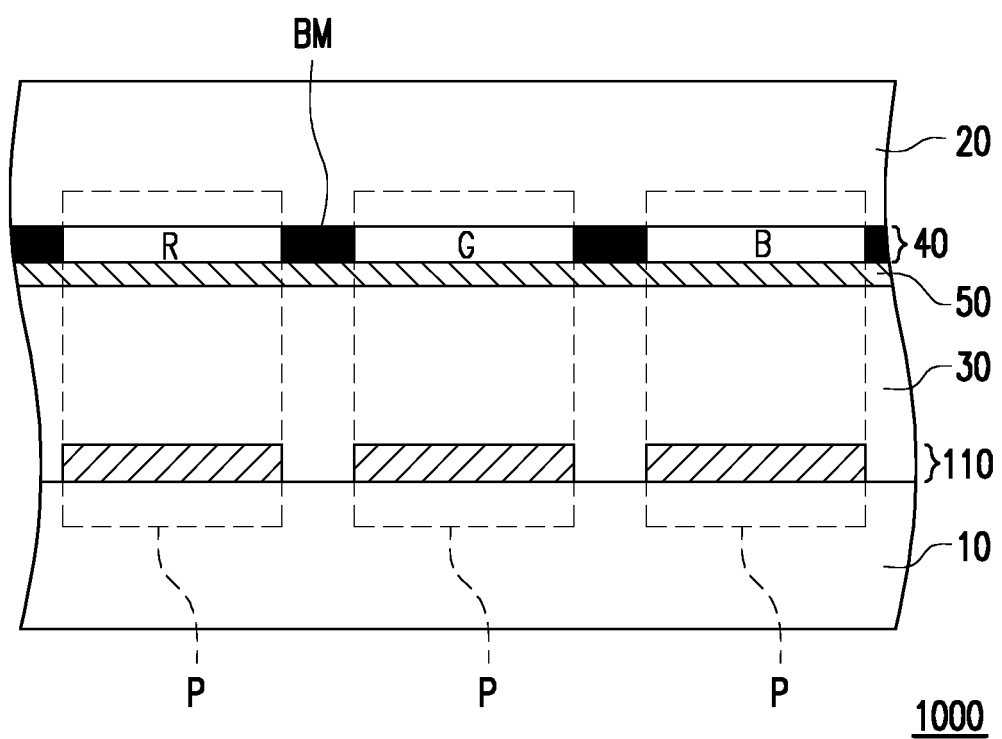
FIG. 1 is a schematic cross-sectional view illustrating a display panel according to an embodiment of the invention.

FIG. 1 is a schematic cross-sectional view illustrating a display panel according to an embodiment of the invention. With reference to FIG. 1, the display panel 1000 includes a first substrate 10, a second substrate 20, a display medium 30, a device layer 110, a color filter layer 40, and an electrode layer 50. The display panel 1000 is, for instance, an LCD panel or any other display panel.

The first substrate 10 may be made of glass, quartz, organic polymer, or other appropriate materials. The device layer 110 is located on the first substrate 10. The device layer 110 includes an active device array, pixel electrode patterns, and so on, and the detailed structure of the device layer 110 will be elaborated below.

The second substrate 20 is located opposite to the first substrate 10. The second substrate 20 may be made of glass, quartz, organic polymer, and so forth.

The display medium 30 is located between the first substrate 10 and the second substrate 20. The display medium 30 can include liquid crystal molecules, an electrophoretic display medium, or other suitable display media. In the present embodiment, the display medium 30 is liquid crystal molecules, which should however not be construed as a limitation to the invention.

The color filter layer 40 is located on the surface of the second substrate 20; however, the invention is not limited thereto. In another embodiment of the invention, the color filter layer 40 may be located on the first substrate 10. The color filter layer 40 includes a plurality of red filter patterns R, a plurality of green filter patterns G, and a plurality of blue filter patterns B. As shown in FIG. 1, in the present embodiment, the red filter patterns R, the green filter patterns G, and the blue filter patterns B respectively correspond to the pixel structures P of the device layer 110 on the first substrate 10, for instance; however, the invention is not limited thereto. The second substrate 20 may further have a black matrix BM. The black matrix BM defines a plurality of unit areas where the red filter patterns R, the green filter patterns G, and the blue filter patterns B are respectively located therein.

The electrode layer 50 described in the present embodiment is located on the second substrate 20. The electrode layer 50 is a transparent conductive layer made of metal oxide, such as indium tin oxide (ITO), indium zinc oxide (IZO), and so forth. Besides, the electrode layer 50 covers the color filter layer 40, which should however not be construed as a limitation to the invention. An electric field may be generated between the electrode layer 50 and the device layer 110, so as to control or drive the display medium 30.

Figure 2:
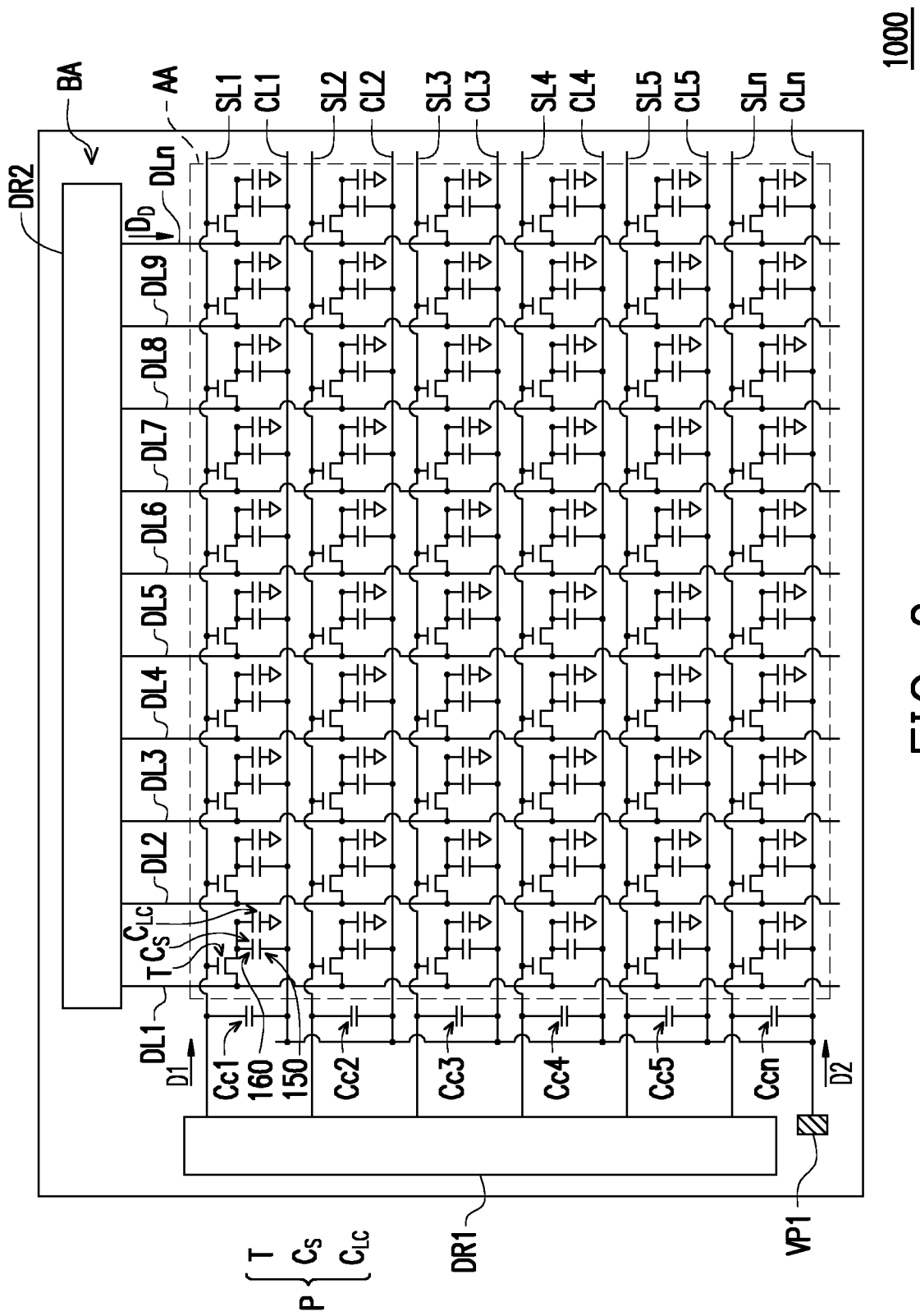
FIG. 2 is an equivalent circuit diagram illustrating a display panel according to an embodiment of the invention.

FIG. 2 is an equivalent circuit diagram illustrating a display panel according to an embodiment of the invention. With reference to FIG. 2, the display panel 1000 has a display area AA and a non-display area BA surrounding the display area AA, and the display panel 1000 includes a plurality of scan lines SL1-SLn, a plurality of data lines DL1-DLn, a plurality of pixel structures P, at least one driving device DR1-DR2, a plurality of capacitor electrode lines CL1-CLn, and a plurality of compensation capacitors Cc1-Ccn. Here, n is an integer.

The scan lines SL1-SLn and the data lines DL1-DLn extend to the display area AA from the non-display area BA. The scan lines SL1-SLn and the data lines DL1-DLn are alternately arranged, and an insulation layer is sandwiched between the scan lines SL1-SLn and the data lines DL1-DLn. In other words, extension directions of the data lines DL1-DLn are not parallel to extension directions of the scan lines SL1-SLn. Moreover, it is favorable for the extension directions of the data lines DL1-DLn to be perpendicular to the extension directions of the scan lines SL1-SLn. In consideration of electrical conductivity, the data lines DL1-DLn and the scan lines SL1-SLn are often made of metal materials. However, the invention is not limited thereto. According to other embodiments of the invention, the scan lines SL1-SLn and the data lines DL1-DLn can also be made of other conductive materials; for example, an alloy, metal nitride, metal oxide, metal oxynitride, another appropriate material, or a layer in which the metal material and any other conductive material are stacked to each other.

Each of the pixel structures P is located in the display area AA and is electrically connected to a corresponding one of the data lines DL1-DLn and a corresponding one of the scan lines SL1-SLn. Besides, each of the pixel structures P includes an active device T and a pixel electrode (not shown in FIG. 2) electrically connected to the active device T. Here, the pixel electrode in each of the pixel structures P and the electrode layer 50 (as shown in FIG. 1) together constitute a liquid crystal capacitor CLC. The pixel electrode 110 is a transparent conductive layer that includes a metal oxide, such as ITO, IZO, aluminum tin oxide (ATO), aluminum zinc oxide (AZO), indium germanium zinc oxide (IGZO), other suitable oxides, or a stacked layer having at least two of the above-mentioned materials, for instance. The active device T is a thin film transistor (TFT) that includes a gate, a channel layer, a drain, and a source (not shown), for instance. The gate is electrically connected to the scan line SL1, and the source is electrically connected to the data line DL1. That is, when a control signal is inputted to the scan line SL1, the scan line SL1 and the gate are electrically connected to each other; when a control signal is inputted to the data line DL1, the data line DL1 and the source are electrically connected to each other. In the present embodiment, the active device T is a bottom gate TFT, for instance; however, the invention is not limited thereto. According to another embodiment of the invention, the active device T may also be a top-gate TFT. Besides, the gate and the scan lines SL1-SLn are located in the same film layer, and the drain, the source, and the data lines DL1-DLn are located in the same film layer, for instance. According to the present embodiment, each of the pixel structures P further includes a storage capacitor Cs electrically connected to the active device T. The storage capacitor $C_S$ includes a first capacitor electrode 150 and a second capacitor electrode 160. The first capacitor electrode 150 is connected to one of the capacitor electrode lines (i.e., the capacitor electrode line CL1), and the second capacitor electrode 160 is electrically connected to the active device T of the pixel structure P.

With reference to FIG. 2, the driving devices DR1-DR2 are located in the non-display area BA and are electrically connected to the pixel structures P, and the capacitor electrode lines CL1-CLn extend to the display area AA from the non-display area BA. According to the present embodiment, the display panel 1000 further includes a voltage input pad VP1. The driving device DR1 is located in the non-display area BA on one side of the display area AA, such that the driving device DR1 is electrically connected to the scan lines SL1-SLn. The voltage input pad VP1 and the driving device DR1 are located in the non-display area BA on the same side of the display area AA. The driving device DR1 is electrically connected to the pixel structures P through the scan lines SL1-SLn, and the voltage input pad VP1 is electrically connected to the capacitor electrode lines CL1-CLn. In the present embodiment, the compensation capacitors Cc1-Ccn are located between the display area AA and the driving device DR1. Here, one end of each of the compensation capacitors Cc1-Ccn is electrically connected to one of the scan lines SL1-SLn, and the other end of each of the compensation capacitors Cc1-Ccn is electrically connected to the corresponding one of the capacitor electrode lines CL1-CLn. Besides, each of the compensation capacitors Cc1-Ccn is electrically connected to the pixel structures P in one row. The capacitance of each of the compensation capacitors Cc1-Ccn is greater than or at least equal to 10 picofarads (pF), preferably 10 pF-700 pF, and the effects resulting from the compensation capacitors Cc1-Ccn will be elaborated hereinafter. The driving device DR1 and the voltage input pad VP1 are located in the non-display area BA on one side of the display area AA; therefore, the voltage of the control signal of the scan lines SL1-SLn is inputted into the scan lines SL1-SLn in a direction D1, for instance, and the common voltage Vcom is inputted into the capacitor electrode lines CL1-CLn in a direction D2, for instance. That is, the voltage of the control signal of the scan lines SL1-SLn and the common voltage of the capacitor electrode lines CL1-CLn are inputted into the pixel structures P in the same direction in a single-side driving manner. By contrast, the driving device DR2 is located on one side of the display area AA adjacent to the driving device DR1 and transmits data signals to the pixel structures P through the data lines DL1-DLn. The voltages of the data signals of the data lines DL1-DLn are inputted into the data lines DL1-DLn in a direction DD, for instance. That is, the voltages of the data signals of the data lines DL1-DLn are inputted into the pixel structures P in one single direction in a single-side driving manner. It is for sure that the invention should not be construed as limited to the embodiments described above.

In view of the above, the compensation capacitors Cc1-Ccn are arranged in the non-display area of the display panel, so as to better prevent the voltage of the data signal of the data lines DL1-DLn or the scan lines SL1-SLn of the display panel from creating the coupling effects that affect the common voltage, and thereby uniformity of the common voltage of the display panel can be guaranteed. The uniformity of the common voltage lessens the flicker in the images displayed on the display panel, and the display performance of the display panel is also improved.

Figure 3:
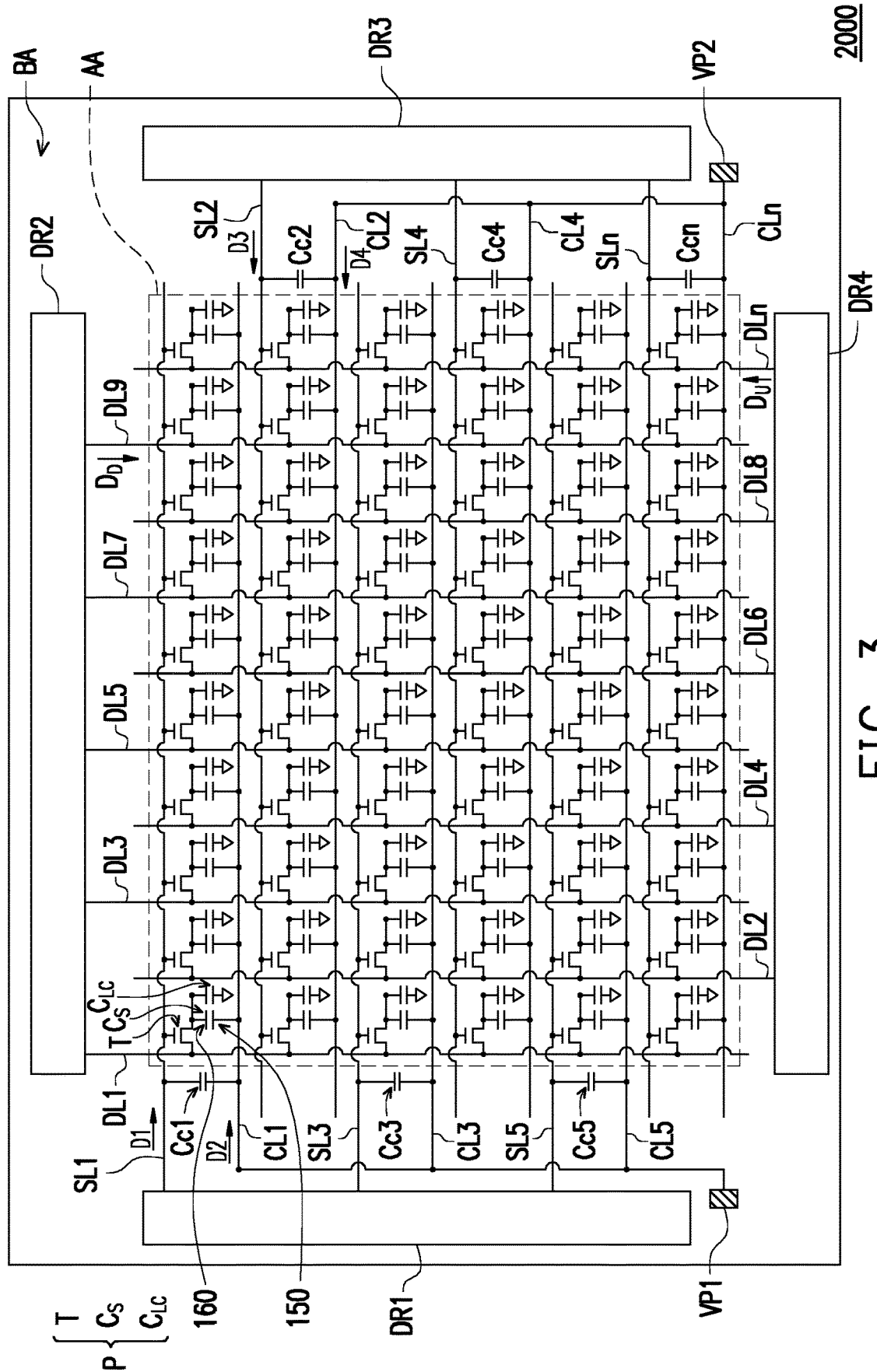
FIG. 3 is an equivalent circuit diagram illustrating a display panel according to another embodiment of the invention.

FIG. 3 is an equivalent circuit diagram illustrating a display panel according to another embodiment of the invention. The equivalent circuit diagram illustrating the display panel 2000 in FIG. 3 is similar to the equivalent circuit diagram illustrating the display panel 1000 in FIG. 2; therefore, the identical or similar devices in these embodiments are represented by the identical or similar reference numbers and will not be further explained. The difference between the display panels 2000 and 1000 lies in that the display panel 2000 is equipped with the driving devices DR1-DR4 and the voltage input pads VP1-VP2. Particularly, the driving devices DR1-DR4 are located in the non-display area BA and are electrically connected to the pixel structures P, and the capacitor electrode lines CL1-CLn extend to the display area AA from the non-display area BA.

According to the present embodiment, the display panel 2000 further includes voltage input pads VP1-VP2. The driving devices DR1,DR3 are located in the non-display area BA on two opposite sides of the display area AA, such that the driving devices DR1,DR3 are electrically connected to the scan lines SL1-SLn. The voltage input pads VP1-VP2 are also respectively located in the non-display area BA on the two opposite sides of the display area AA. That is, the voltage input pad VP1 and the corresponding driving device DR1 are located in the non-display area BA on the same side of the display area AA, and so are the voltage input pad VP2 and the corresponding driving device DR3. The driving device DR1 is electrically connected to the pixel structures P in odd rows through the odd-numbered scan lines (e.g., the scan lines SL1, SL3, SL5, and so on), and the voltage input pad VP1 is electrically connected to the odd-numbered capacitor electrode lines (e.g., the capacitor electrode lines CL1, CL3, CL5, and so on). The driving device DR3 is electrically connected to the pixel structures P in even rows through the even-numbered scan lines (e.g., the scan lines SL2, SL4, SLn, and so on), and the voltage input pad VP2 is electrically connected to the even-numbered capacitor electrode lines (e.g., the capacitor electrode lines CL2, CL4, CLn, and so on). In the present embodiment, n is an even integer, which should however not be construed as a limitation to the invention; in another embodiment of the invention, n may be an odd integer. Here, the compensation capacitors Cc1, Cc3, and Cc5 in the odd rows are formed between the display area AA and the driving device DR1. One end of each of the compensation capacitors Cc1, Cc3, and Cc5 in the odd rows is electrically connected to one of the odd-numbered scan lines (e.g., the scan lines SL1, SL3, SL5, and so on), and the other end is electrically connected to the corresponding one of the odd-numbered capacitor electrode lines (e.g., the capacitor electrode lines CL1, CL3, CL5, and so on). The compensation capacitors Cc2, Cc4, and Ccn in the even rows are formed between the display area AA and the driving device DR3. One end of each of the compensation capacitors Cc2, Cc4, and Ccn in the odd rows is electrically connected to one of the even-numbered scan lines (e.g., the scan lines SL2, SL4, SLn, and so on), and the other end is electrically connected to the corresponding one of the even-numbered capacitor electrode lines (e.g., the capacitor electrode lines CL2, CL4, CLn, and so on). Each of the compensation capacitors Cc1-Ccn is electrically connected to the pixel structures P in one row, the capacitance of each of the compensation capacitors Cc1-Ccn is greater than or at least equal to 10 pF, preferably 10 pF-700 pF, and the effects resulting from the compensation capacitors Cc1-Ccn will be elaborated hereinafter.

In the present embodiment, the voltages of the control signals of the odd-numbered scan lines SL1, SL3, and SL5 are inputted into the odd-numbered scan lines SL1, SL3, and SL5 in the direction D1, and the common voltage is inputted to the odd-numbered capacitor electrode lines CL1, CL3, and CL2 in the direction D2, for instance. Besides, the voltages of the control signals of the even-numbered scan lines SL2, SL4, and SLn are inputted into the even-numbered scan lines SL2, SL4, and SLn in a direction D3, and the common voltage is inputted to the even-numbered capacitor electrode lines CL2, CL4, and CLn in a direction D4, for instance. That is, the voltages of the control signals of the scan lines SL1-SLn and the common voltage of the capacitor electrode lines CL1-CLn are inputted into the pixel structures P in different directions in a double-side driving manner.

By contrast, the driving device DR2 is located on one side of the display area AA adjacent to the driving device DR1 and is electrically connected to the pixel structures P in odd-numbered columns through the odd-numbered data lines (i.e., the data lines DL1, DL3, DL5,DL7,DL9, and so on). The driving device DR4 is located on one side of the display area AA opposite to the driving device DR2 and is electrically connected to the pixel structures P in even-numbered columns through the even-numbered data lines (i.e., the data lines DL2, DL4, DL6,DL8,DLn, and so on). In the present embodiment, n is an even integer, which should however not be construed as a limitation to the invention; in another embodiment of the invention, n may be an odd integer. The voltages of the data signals of the odd-numbered data lines DL1, DL3, DL5, DL7, and DL9 are inputted into the odd-numbered data lines in a direction DD, and the voltages of the data signals of the even-numbered data lines DL2, DL4, DL6, DL8, and DLn are inputted into the even-numbered data lines in a direction DU. That is, the voltages of the data signals of the odd-numbered data lines and the voltages of the data signals of the even-numbered data lines are inputted into the pixel structures P in different directions in a double-side driving manner. However, the invention is not limited thereto; in another embodiment, the voltages of the data signals of the data lines DL1-DLn may be inputted into the pixel structures P in one single direction in a single-side driving manner, which is similar to the arrangement of the driving device DR2 and the data lines DL1-DLn as shown in FIG. 2. In view of the above, the compensation capacitors Cc1-Ccn are arranged in the non-display area of the display panel, so as to better prevent the voltages of the data signals of the data lines DL1-DLn or the scan lines SL1-SLn of the display panel from creating the coupling effects that affect the common voltage, and thereby uniformity of the common voltage of the display panel can be guaranteed. The uniformity of the common voltage lessens the flicker in the images displayed on the display panel, and the display performance of the display panel is also improved.

Figure 4:
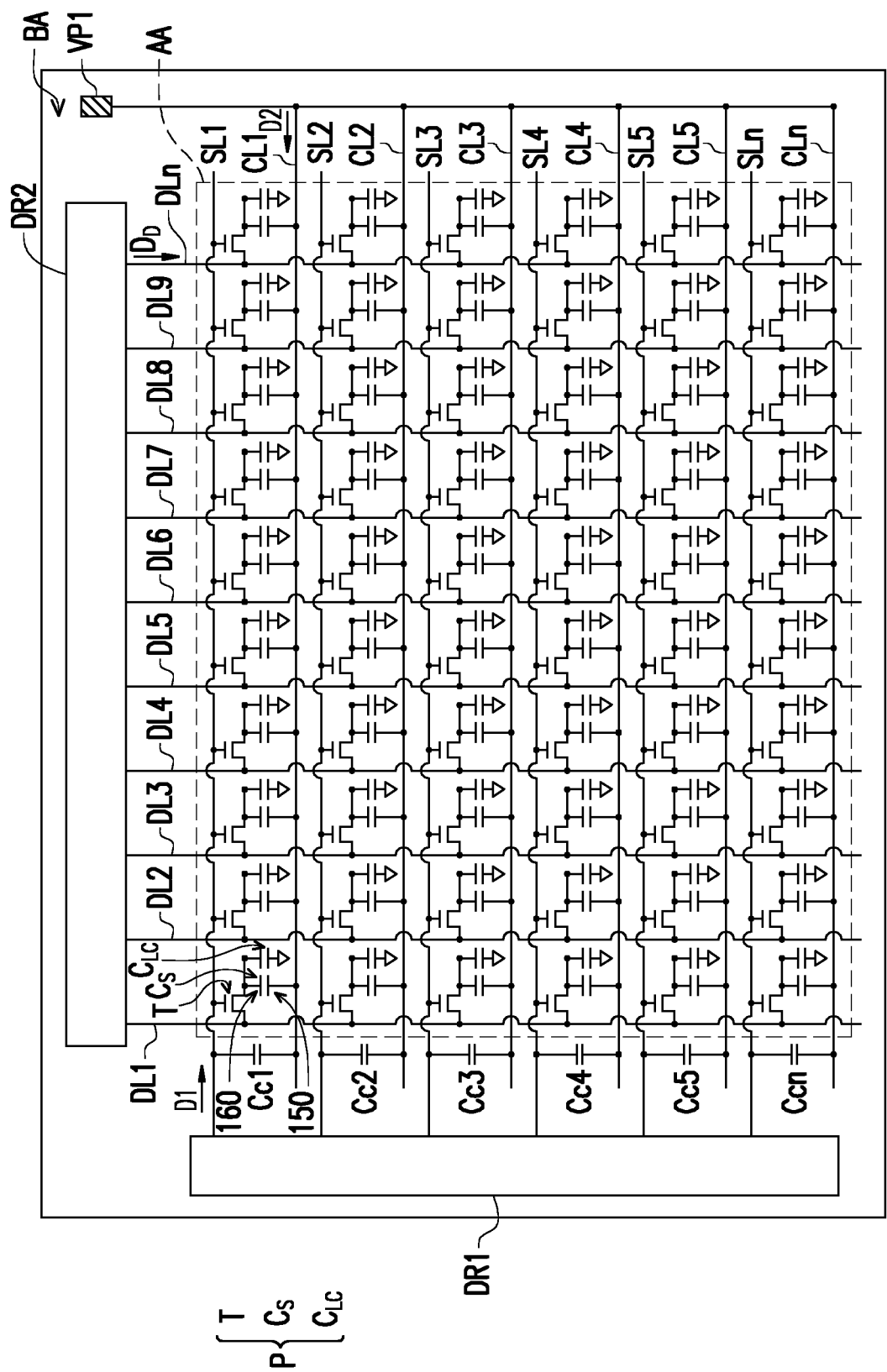
FIG. 4 is an equivalent circuit diagram illustrating a display panel according to another embodiment of the invention.

FIG. 4 is an equivalent circuit diagram illustrating a display panel according to another embodiment of the invention. The equivalent circuit diagram illustrating the display panel 3000 in FIG. 4 is similar to the equivalent circuit diagram illustrating the display panel 1000 in FIG. 2; therefore, the identical or similar devices in these embodiments are represented by the identical or similar reference numbers and will not be further explained. The difference between the display panels 3000 and 1000 lies in that the driving device DR1 is located in the non-display area BA on one side of the display area AA, and the voltage input pad VP1 of the display panel 3000 is located in the non-display area BA on the other side of the display area AA, such as opposite to the one side of the display area AA. To be more specific, the driving device DR1 is located in the non-display area BA on one side of the display area AA, such that the driving device DR1 is electrically connected to the scan lines SL1-SLn and is electrically connected to the pixel structures P through the scan lines SL1-SLn. The voltage input pad VP1 is located in the non-display area BA on the other side of the display area AA opposite to the one side of the display area AA and is electrically connected to the capacitor electrode lines CL1-CLn. In the present embodiment, the compensation capacitors Cc1-Ccn are located between the display area AA and the driving device DR1. Here, one end of each of the compensation capacitors Cc1-Ccn is electrically connected to one of the scan lines SL1-SLn, and the other end of each of the compensation capacitors Cc1-Ccn is electrically connected to the corresponding one of the capacitor electrode lines CL1-CLn. Besides, each of the compensation capacitors Cc1-Ccn is electrically connected to the pixel structures P in one row. The capacitance of each of the compensation capacitors Cc1-Ccn is greater than or at least equal to 10 pF, preferably 10 pF-700 pF, and the effects resulting from the compensation capacitors Cc1-Ccn will be elaborated hereinafter.

The driving device DR1 is located in the non-display area BA on one side of the display area AA, and the voltage input pad VP1 is located in the non-display area BA on the opposite side of the display area AA; therefore, the voltages of the control signals of the scan lines SL1-SLn are inputted into the scan lines SL1-SLn in a direction D1, for instance, and the common voltage Vcom is inputted into the capacitor electrode lines CL1-CLn in the direction D2, for instance. That is, the voltages of the control signals of the scan lines SL1-SLn and the common voltage of the capacitor electrode lines CL1-CLn are input into the pixel structures P in different directions in a single-side driving manner. In view of the above, the compensation capacitors Cc1-Ccn are arranged in the non-display area of the display panel, so as to better prevent the voltages of the data signals of the data lines DL1-DLn or the scan lines SL1-SLn of the display panel from creating the coupling effects that affect the common voltage, and thereby uniformity of the common voltage of the display panel can be guaranteed. The uniformity of the common voltage lessens the flicker in the images displayed on the display panel, and the display performance of the display panel is also improved.

Arrangements of devices in the device layer 110 in the display panel respectively shown in FIG. 2 to FIG. 4 are elaborated hereinafter. FIG. 5 to FIG. 12 are schematic top views illustrating the device layer 110 (shown in FIG. 1) corresponding to compensation capacitors in the non-display area and the pixel structures in the display area according to several embodiments of the invention. For clear illustration, the structure of the compensation capacitor in one of the scan lines is shown in FIG. 5 to FIG. 12. People having ordinary skill in the art are able to deduce the design of other compensation capacitors of other corresponding scan liens from the descriptions below.

Figure 5:
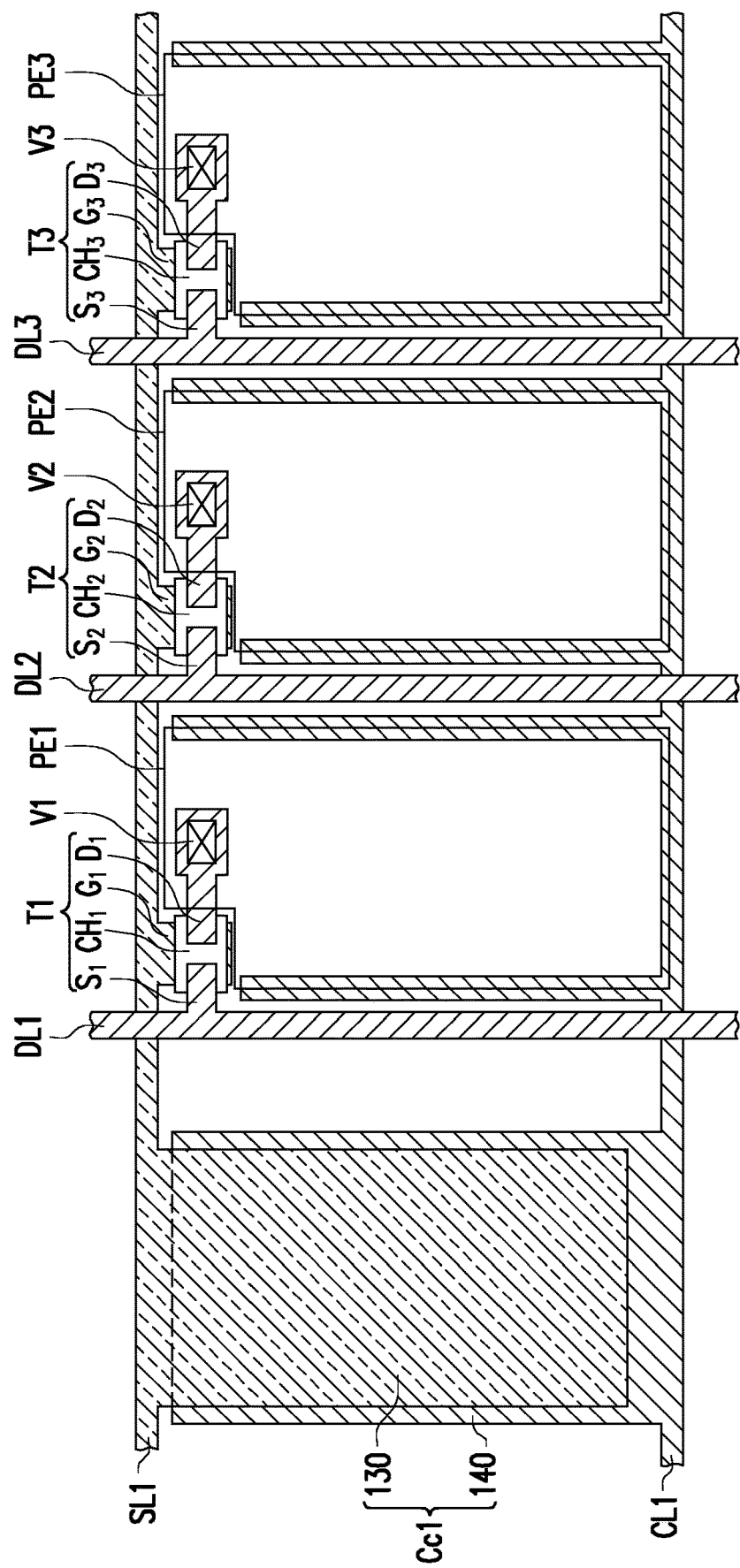
FIG. 5 to FIG. 10 are schematic top views illustrating a device layer of a display panel corresponding to compensation capacitors in a non-display area and pixel structures in a display area according to several embodiments of the invention.

With reference to FIG. 5, the device layer provided in the present embodiment includes data lines DL1-DL3, a scan line SL1, active devices T1-T3, pixel electrodes PE1-PE3, contact windows V1-V3, a capacitor electrode line CL1, and a compensation capacitor Cc1. According to the present embodiment, the active device T1 includes a gate $G_1$, a semiconductor layer $CH_1$, a source $S_1$, and a drain $D_1$; the active device T2 includes a gate $G_2$, a semiconductor layer $CH_2$, a source $S_2$, and a drain $D_2$; the active device T3 includes a gate $G_3$, a semiconductor layer $CH_3$, a source $S_3$, and a drain $D_3$. For instance, in the active device T1, the gate $G_1$ is electrically connected to the scan line SL1. The semiconductor layer $CH_1$ is located above the gate $G_1$. The source $S_1$ and the drain $D_1$ are located above the semiconductor layer $CH_1$, and the source $S_1$ is electrically connected to the data line DL1. The pixel electrode PE1 is electrically connected to the drain $D_1$ of the active device T1 through the contact window V1, the pixel electrode PE2 is electrically connected to the drain $D_2$ of the active device T2 through the contact window V2, and the pixel electrode PE3 is electrically connected to the drain $D_3$ of the active device T3 through the contact window V3.

An extension direction of the capacitor electrode line CL1 is parallel to an extension direction of the scan line SL1, and the capacitor electrode line CL1 includes a main portion and a plurality of branch portions (not shown). The main portion is substantially parallel to the scan line SL1, and the branches are connected to the main portion and are substantially parallel to the data lines DL1-DL3. In the present embodiment, the branch portions are located on sides of the data lines DL1~DLn. For instance, the capacitor electrode line CL1 (the main portion and the branch portions) overlaps with the pixel electrode PE1 to form the storage capacitor (not shown). Hence, the capacitor electrode line CL1 serves as the first capacitor electrode 150 of the storage capacitor, and the pixel electrode PE1 serves as the second capacitor electrode 160 of the storage capacitor. Similarly, the pixel electrode PE2 and the capacitor electrode line CL1 may constitute a storage capacitor of another pixel structure, and the pixel electrode PE3 and the capacitor electrode line CL1 may also constitute a storage capacitor of another pixel structure.

According to the embodiment shown in FIG. 5, the capacitor electrode line CL1 and the scan line SL1 belong to different film layers, and an insulation layer (not shown) is sandwiched between the capacitor electrode line CL1 and the scan line SL1. In the present embodiment, the compensation capacitor Cc1 includes a first electrode 130 and a second electrode 140, the first electrode 130 extends from the scan line SL1, and the second electrode 140 extends from the capacitor electrode line CL1. The first electrode 130 and the second electrode 140 are overlapped, and an insulation layer is sandwiched between the first electrode 130 and the second electrode 140, so as to generate the compensation capacitor Cc1. In an alternative embodiment, the first electrode 130 extends from the capacitor electrode line CL1, and the second electrode 140 extends from the scan line SL1. An insulation layer is sandwiched between the first electrode 130 and the second electrode 140, so as to generate the compensation capacitor Cc1 (not shown).

Figure 6:
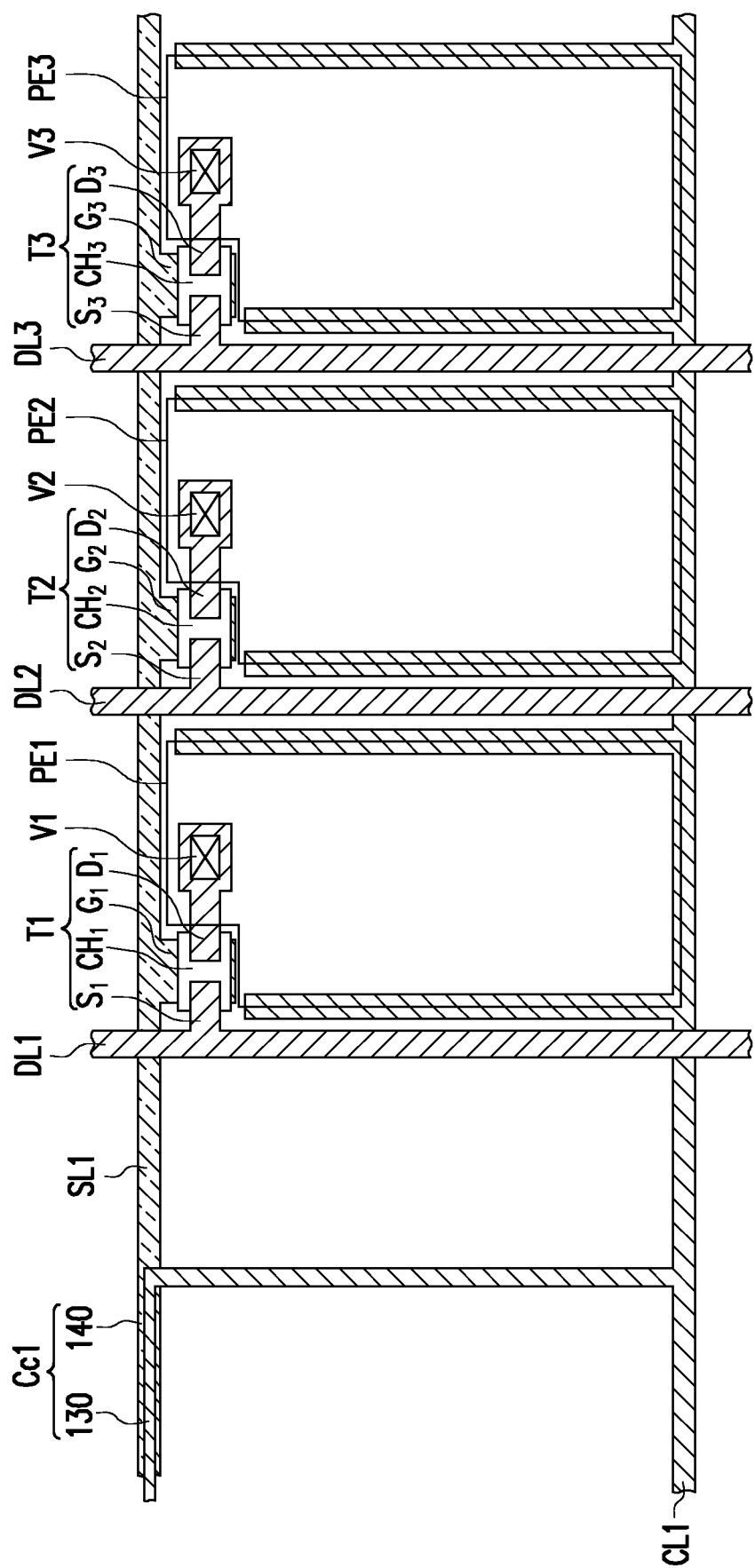

Another embodiment of the pixel structures is shown in FIG. 6. The pixel structures depicted in FIG. 5 and FIG. 6 are similar; therefore, the identical or similar devices in these embodiments are represented by the identical or similar reference numbers and will not be further explained. The difference between the pixel structures depicted in FIG. 5 and FIG. 6 lies in that the first electrode 130 of the compensation capacitor Cc1 illustrated in FIG. 6 extends from the capacitor electrode line CL1 to the top of the scan line SL1 and is overlapped with the scan line SL1. The portion of the scan line SL1 overlapped with the first electrode 130 serves as the second electrode 140 of the compensation capacitor Cc1.

Figure 7:
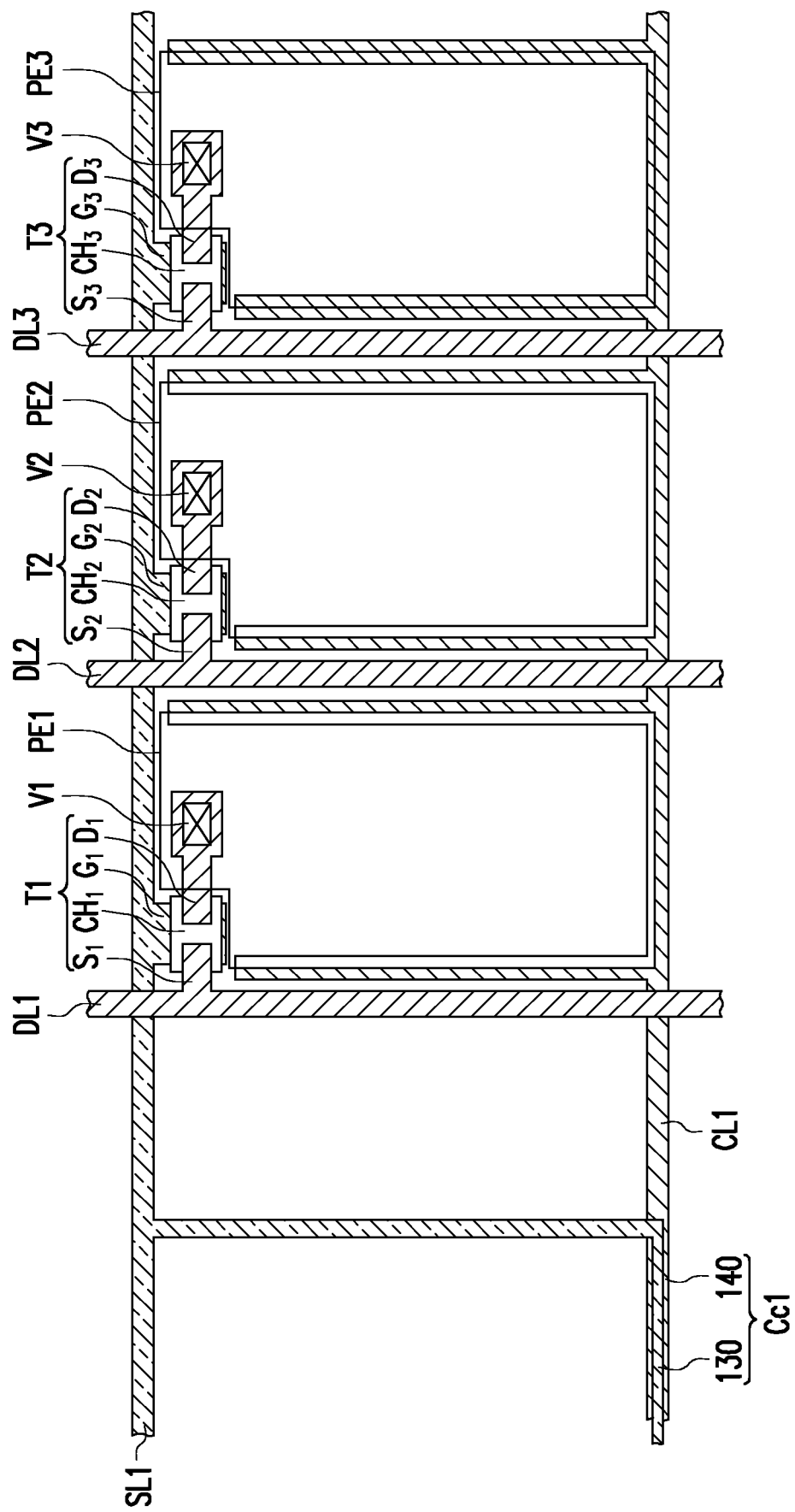

Another embodiment of the pixel structures is shown in FIG. 7. The pixel structures depicted in FIG. 5 and FIG. 7 are similar; therefore, the identical or similar devices in these embodiments are represented by the identical or similar reference numbers and will not be further explained. The difference between the pixel structures depicted in FIG. 5 and FIG. 7 lies in that the first electrode 130 of the compensation capacitor Cc1 illustrated in FIG. 7 extends from the scan line SL1 to the top of the capacitor electrode line CL1 and is overlapped with the capacitor electrode line CL1. The portion of the capacitor electrode line CL1 overlapped with the first electrode 130 serves as the second electrode 140 of the compensation capacitor Cc1.

Figure 8A:
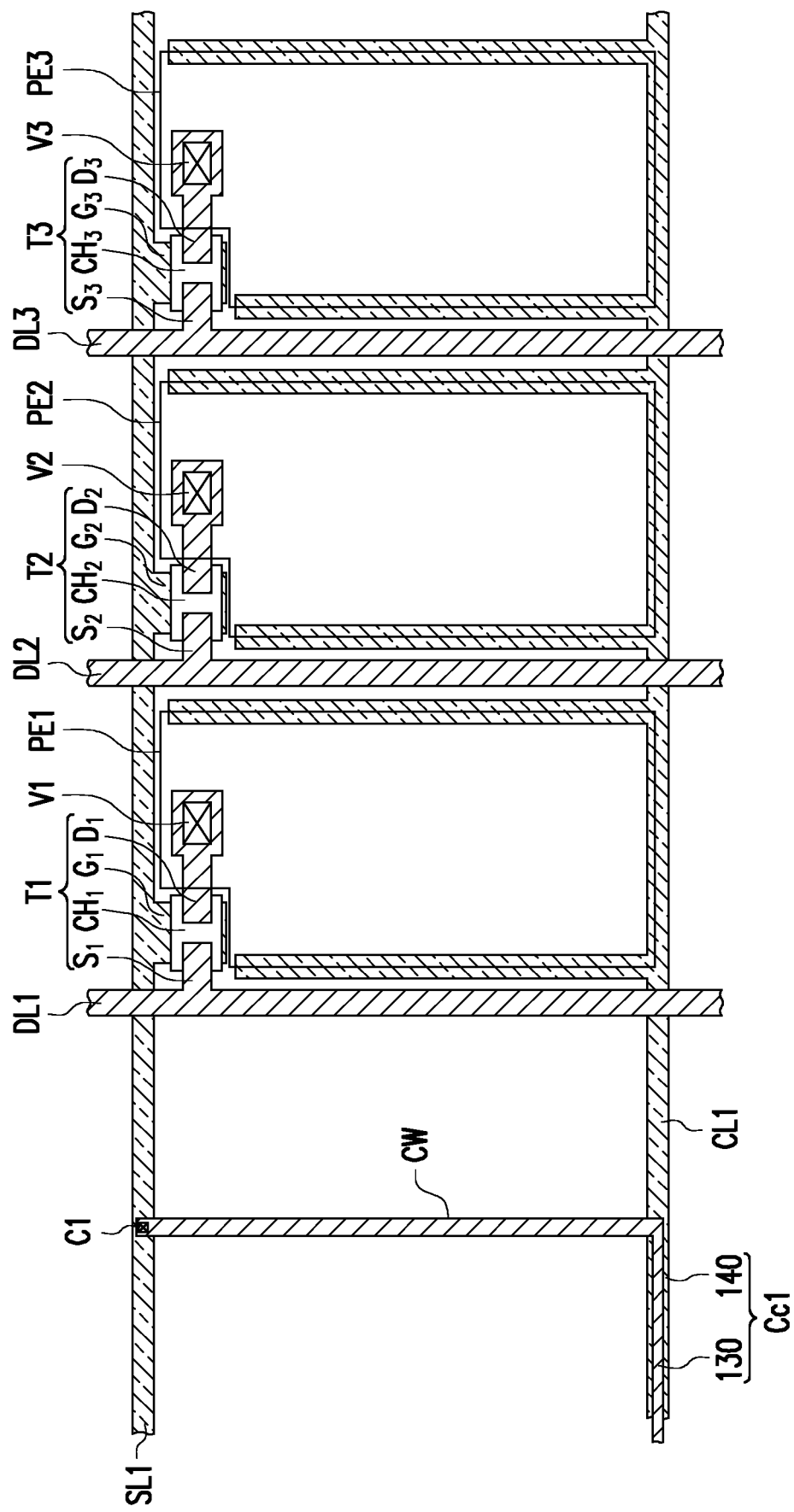
Figure 8B:
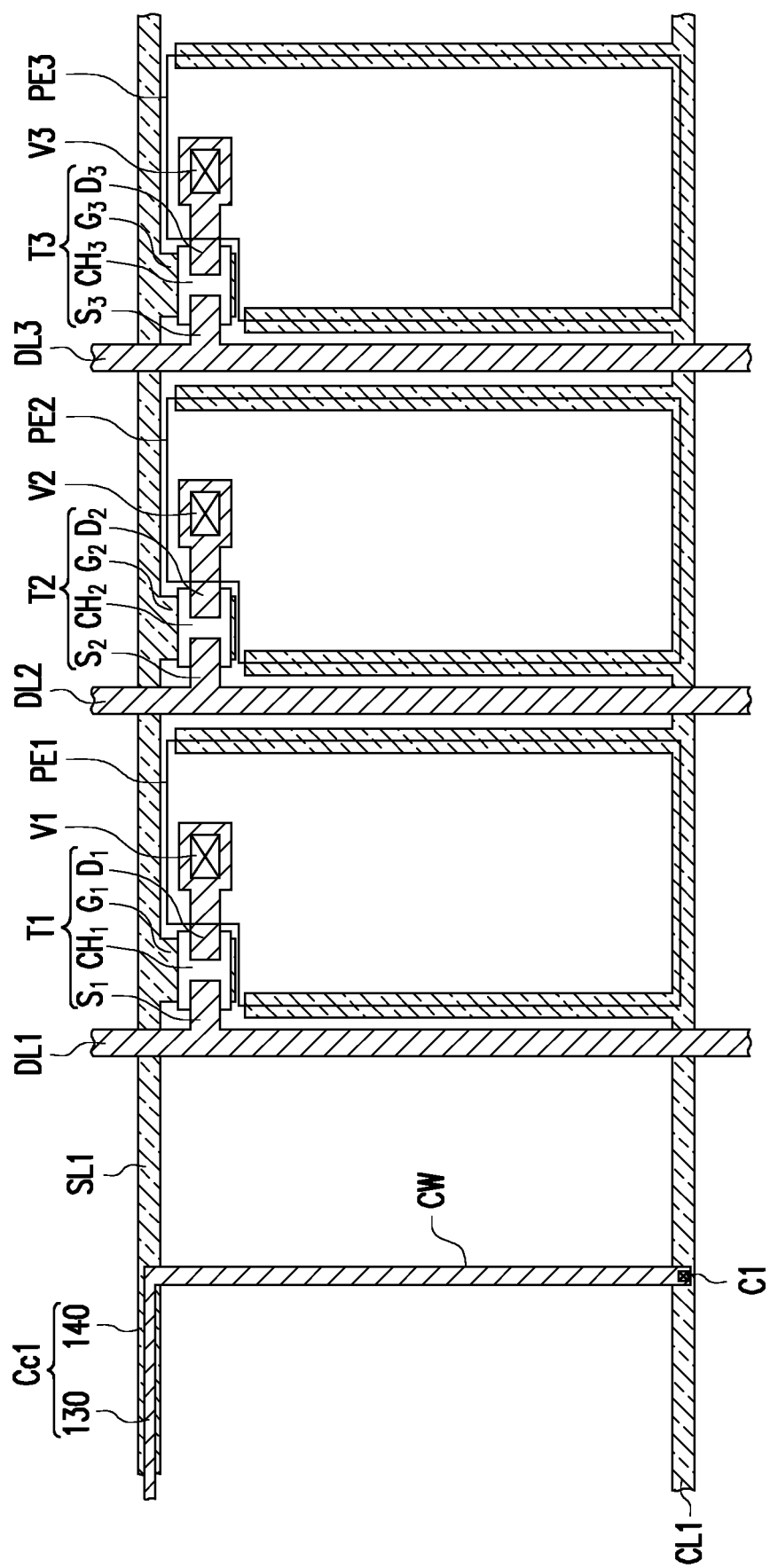

Another embodiment of the pixel structures is shown in FIG. 8A. The pixel structures depicted in FIG. 5 and FIG. 8A are similar; therefore, the identical or similar devices in these embodiments are represented by the identical or similar reference numbers and will not be further explained. The difference between the pixel structures depicted in FIG. 8A and FIG. 5 lies in that the capacitor electrode line CL1 and the scan line SL1 in FIG. 8A are formed in the same film layer, the first electrode 130 of the compensation capacitor Cc1 is electrically connected to the scan line SL1 through a conductive wire CW and via a contact window C1, and the first electrode 130 extends to the top of the capacitor electrode line CL1 and is overlapped with the capacitor electrode line CL1. Here, the capacitor electrode line CL1 overlapped with the first electrode 130 serves as the second electrode 140 of the compensation capacitor Cc1. Besides, in the present embodiment, the conductive wire CW and the data lines DL1-DL3 are formed in the same film layer, which should however not be construed as a limitation to the invention. In another embodiment of the invention, the conductive wire CW and the data lines DL1-DL3 may be in different film layers. According to an alternative embodiment as shown in FIG. 8B, the first electrode 130 of the compensation capacitor Cc1 is electrically connected to the capacitor electrode line CL1 through the conductive wire CW and via the contact window C1, and the first electrode 130 extends to the top of the scan line SL1 and is overlapped with the scan line SL1. The portion of the scan line SL1 overlapped with the first electrode 130 serves as the second electrode 140 of the compensation capacitor Cc1.

Figure 9A:
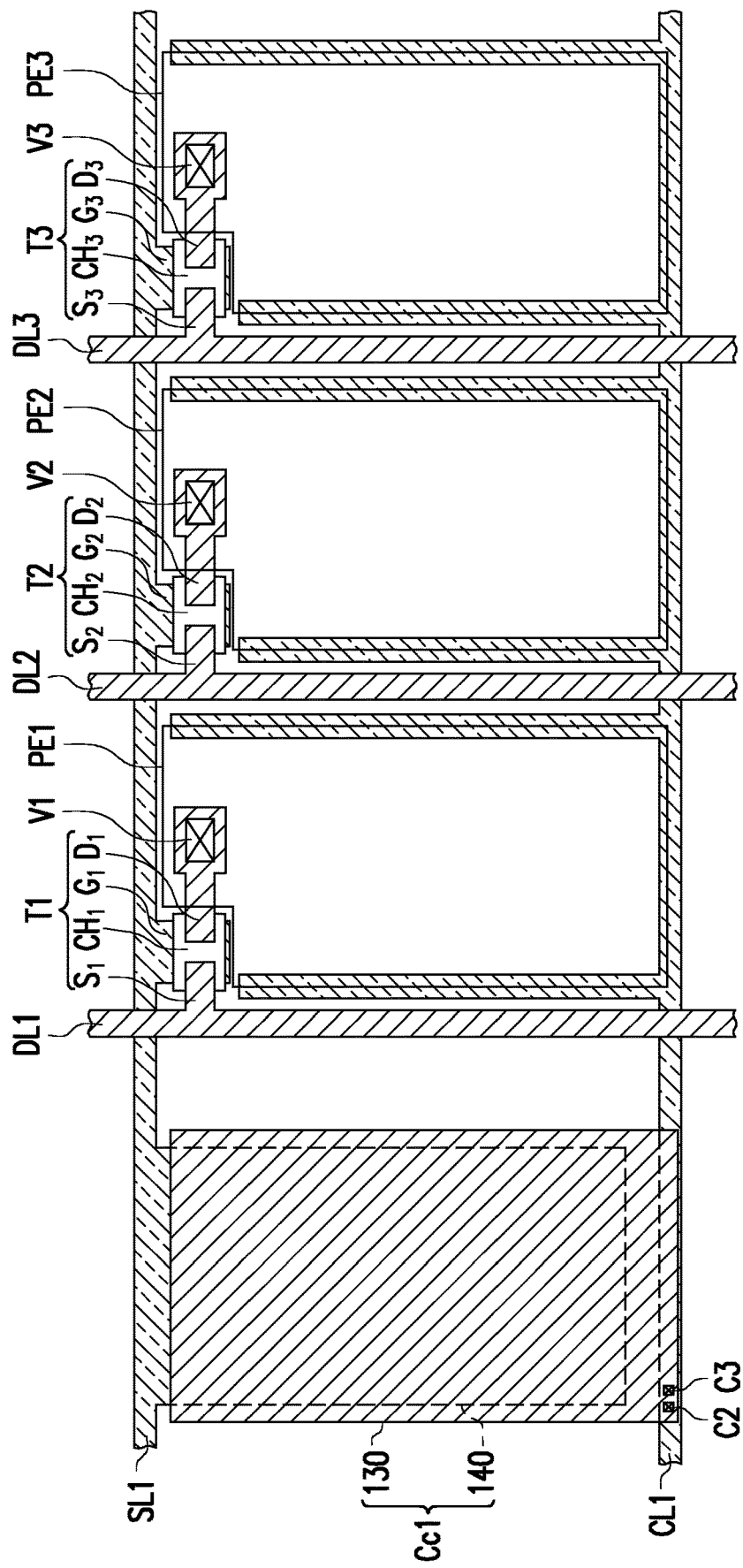
Figure 9B:
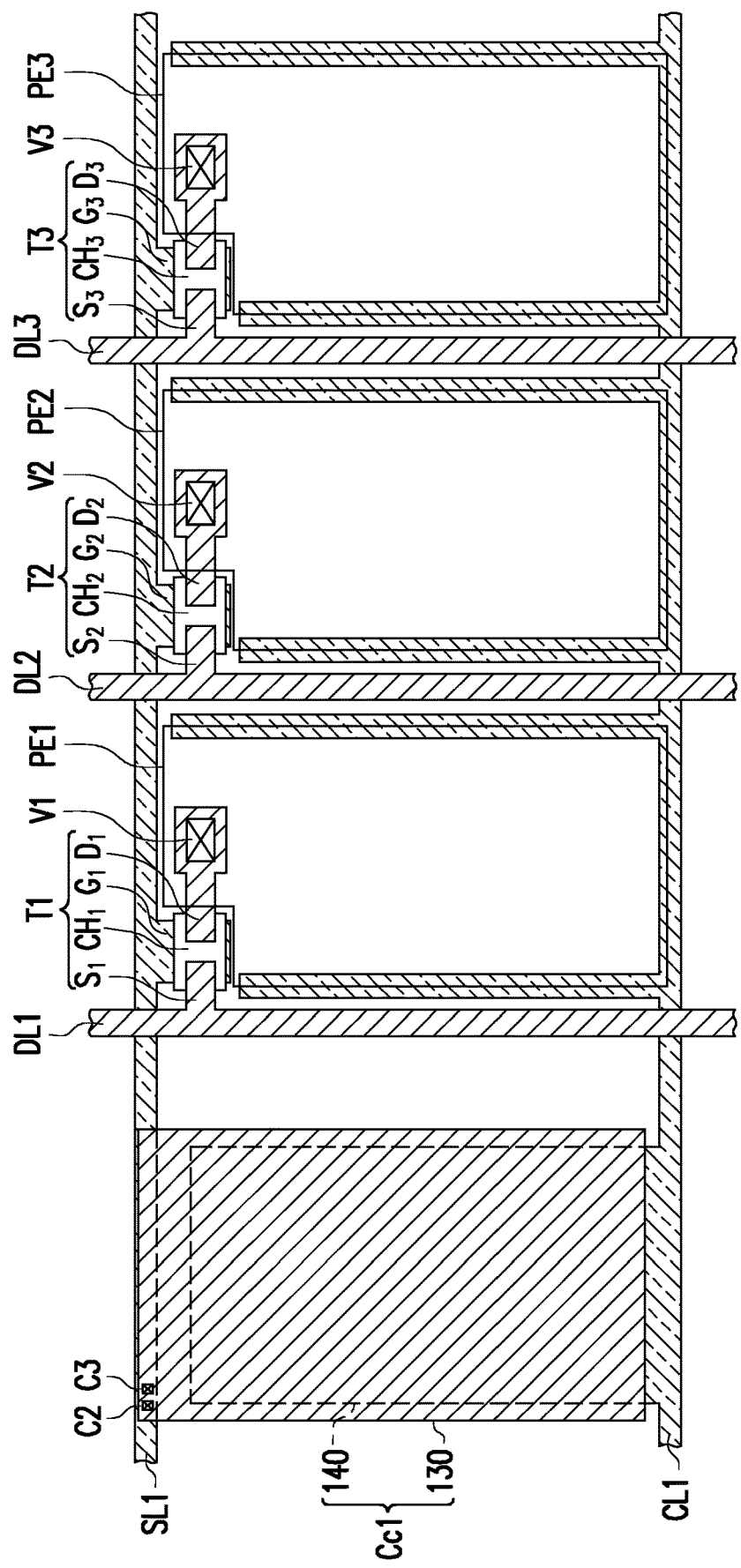

Another embodiment of the pixel structures is shown in FIG. 9A. The pixel structures depicted in FIG. 5 and FIG. 9A are similar; therefore, the identical or similar devices in these embodiments are represented by the identical or similar reference numbers and will not be further explained. The difference between the pixel structures depicted in FIG. 9A and FIG. 5 lies in that the capacitor electrode line CL1 and the scan line SL1 in FIG. 9A are formed in the same film layer, the first electrode 130 of the compensation capacitor Cc1 is electrically connected to the capacitor electrode line CL1 via contact windows C2 and C3, and the second electrode 140 of the compensation capacitor Cc1 extends from the scan line SL1. The first electrode 130 and the second electrode 140 are overlapped, and an insulation layer is sandwiched between the first electrode 130 and the second electrode 140, so as to constitute the compensation capacitor Cc1. Besides, in the present embodiment, the first electrode 130 and the data lines DL1-DL3 are formed in the same film layer, which should however not be construed as a limitation to the invention. In another embodiment of the invention, the first electrode 130 and the data lines DL1-DL3 may be in different film layers. According to an alternative embodiment as shown in FIG. 9B, the first electrode 130 of the compensation capacitor Cc1 is electrically connected to the scan line SL1 via the contact windows C2 and C3, and the second electrode 140 of the compensation capacitor Cc1 extends from the capacitor electrode line CL1. Here, the first electrode 130 and the second electrode 140 are overlapped to generate the compensation capacitor Cc1.

Figure 10:
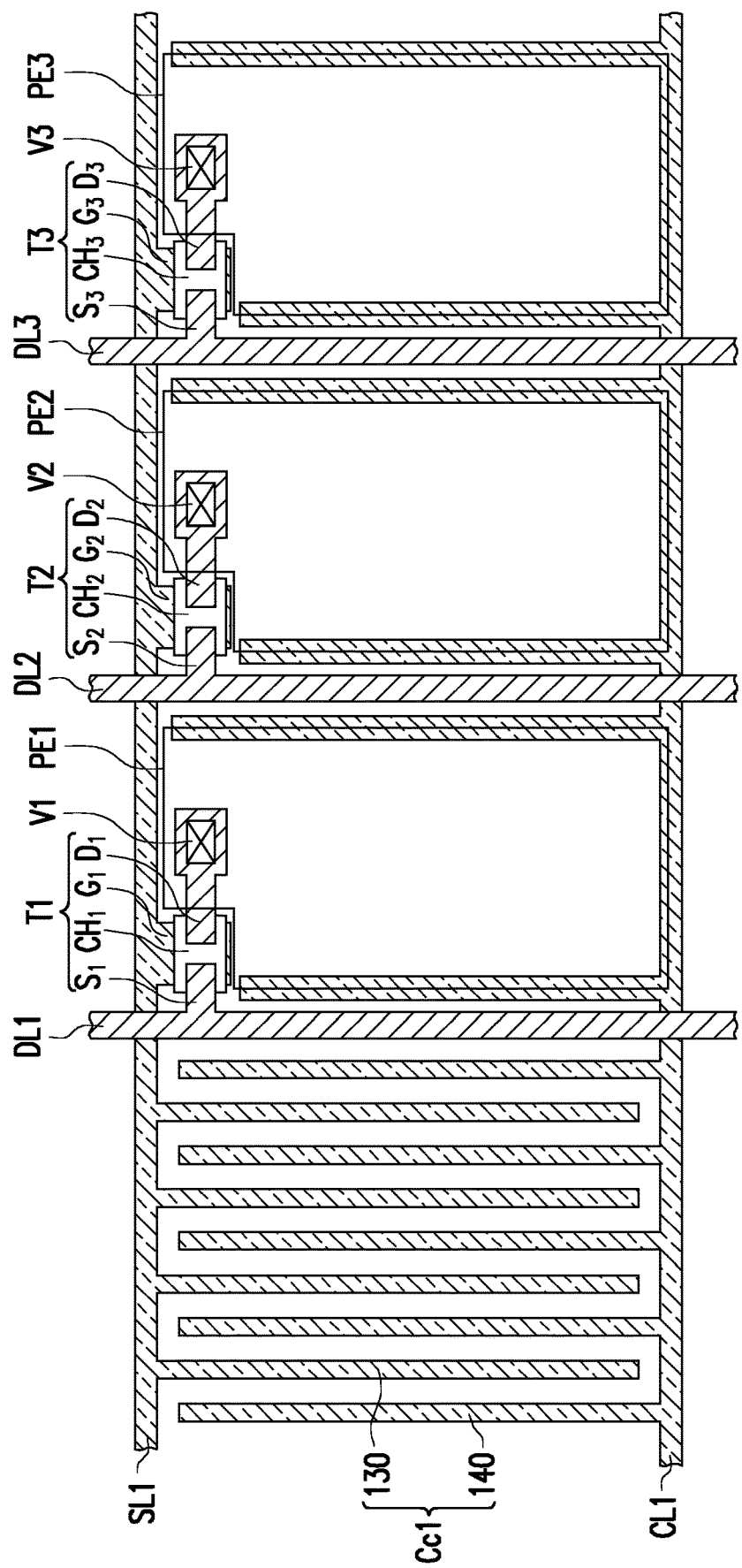

Another embodiment of the pixel structures is shown in FIG. 10. The pixel structures depicted in FIG. 5 and FIG. 10 are similar; therefore, the identical or similar devices in these embodiments are represented by the identical or similar reference numbers and will not be further explained. The difference between the pixel structures depicted in FIG. 10 and FIG. 5 lies in that the capacitor electrode line CL1 and the scan line SL1 in FIG. 10 are formed in the same film layer. In addition, the compensation capacitor Cc1 includes a first electrode 130 and a second electrode 140, the first electrode 130 is electrically connected to and extends from the scan line SL1, and the second electrode 140 is connected to and extends from the capacitor electrode line CL1. The first electrode 130 and the second electrode 140 are both comb shaped and alternately arranged and are coupled in a horizontal (transverse) direction, so as to generate the compensation capacitor Cc1.

Figure 11:
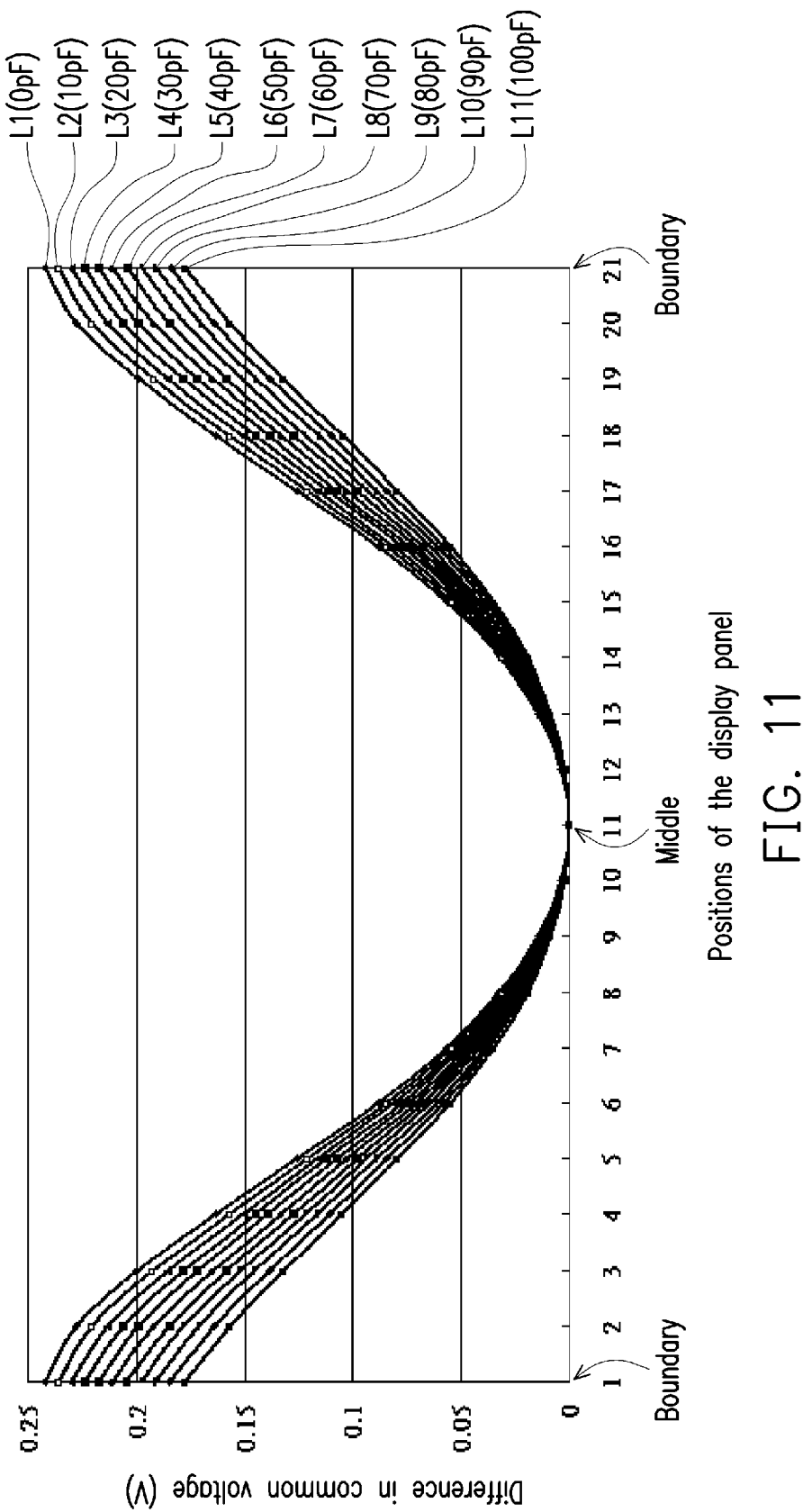
FIG. 11 to FIG. 12 illustrate a relationship between capacitances of compensation capacitors in a display panel and differences in common voltages obtained at different positions of the display panel according to an embodiment of the invention.
Figure 12:
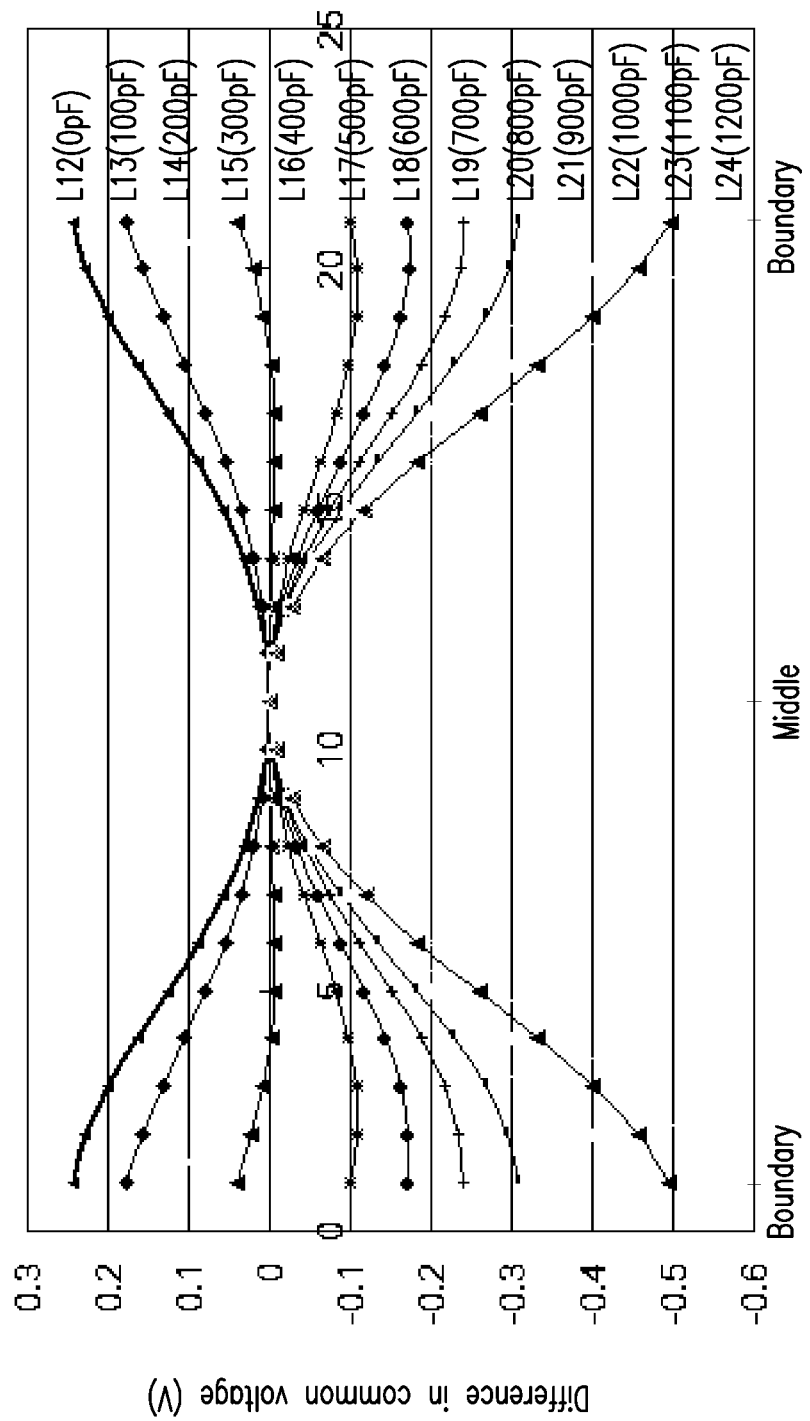

To prove that the design of the compensation capacitors of the display panel described herein is able to improve the uniformity of the common voltage of the display panel, several experimental examples are provided hereinafter for verification purposes. FIG. 11 to FIG. 12 illustrate a relationship between capacitances of compensation capacitors in a display panel and differences in common voltages obtained at different positions of the display panel according to an embodiment of the invention. In FIG. 11 and FIG. 12, the size of the experimental display panel is 65 inches, and the ratio of length to width is 16:9; the display panel is divided into 20 equal segments along a transverse direction, and the 20 segments are defined by 21 positions. The first position and the $21^{st}$ position represent the boundary of the display panel, and the $11^{th}$ position represents the middle of the display panel. The relationship between the capacitances of the compensation capacitors in the display panel and differences in the common voltages ($\Delta$ Vcom) obtained at different positions of the display panel is obtained by selecting several test points on the display panel and performing electrical tests on the test points, respectively.

With reference to FIG. 11, the curves L1 (0 pF), L2 (10 pF), L3 (20 pF), L4 (30 pF), L5 (40 pF), L6 (50 pF), L7 (60 pF), L8 (70 pF), L9 (80 pF), L10 (90 pF), and L11 (100 pF) respectively represent that the capacitances of the compensation capacitors of the display panel are 0 pF, 10 pF, 20 pF, 30 pF, 40 pF, 50 pF, 60 pF, 70 pF, 80 pF, 90 pF, and 100 pF. Here, the curve L1 (0 pF) represents that the capacitance of the compensation capacitor of the display panel is 0 pF, i.e., there is no compensation capacitor. Namely, the curve L1 (0 pF) is obtained by performing the electrical tests on the conventional display panel. Specifically, at the same position shown in FIG. 11, the difference in the common voltages in the curve L1 (0 pF) is relatively large, and the difference in the common voltages in the curve L7 (60 pF) is relatively small. It can thus be deduced that the compensation capacitor having the capacitance of 60 pF is arranged in the non-display area between the driving circuit area and the display area of the display panel, so as to properly compensate the common voltage of the display panel. As such, the influence resulting from the signal voltage of the scan lines or the data lines on the common voltage of the display panel can be reduced, and the uniformity of the common voltage of the display panel can be satisfactory. As shown in FIG. 11, compared to the conventional display panel (not equipped with any compensation capacitor, as shown by the curve L1 (0 pF)), the display panel (as shown by the curves L2 (10 pF)-L11 (100 pF), respectively) provided herein is characterized in that the differences in the common voltages obtained at different positions of the display panel are rather uniform.

With reference to FIG. 12, the curves L12 (0 pF), L13 (100 pF), L14 (200 pF), L15 (300 pF), L16 (400 pF), L17 (500 pF), L18 (600 pF), L19 (700 pF), L20 (800 pF), L21 (900 pF), L22 (1000 pF), L23 (1100 pF), and L24 (1200 pF) respectively represent that the capacitances of the compensation capacitors of the display panel are 0 pF, 100 pF, 200 pF, 300 pF, 400 pF, 500 pF, 600 pF, 700 pF, 800 pF, 900 pF, 1000 pF, 1100 pF, and 1200 pF. Here, the curve L12 (0 pF) (similar to the curve L1 (0 pF) shown in FIG. 11) represents that the capacitance of the compensation capacitor of the display panel is 0 pF, i.e., there is no compensation capacitor. Specifically, at the same position shown in FIG. 12, the difference in the common voltages in the curve L12 (0 pF) is relatively large, and the difference in the common voltages in the curve L13 (100 pF) is relatively small. It can thus be deduced that the compensation capacitor having the capacitance of 100 pF is arranged in the non-display area between the driving circuit area and the display area of the display panel, so as to properly compensate the common voltage of the display panel. As such, the influence resulting from the signal voltage of the scan lines or the data lines on the common voltage of the display panel can be reduced, and the uniformity of the common voltage of the display panel can be satisfactory. As shown in FIG. 12, compared to the conventional display panel (not equipped with any compensation capacitor, as shown by the curve L1 (0 pF)), the display panel (as shown by the curves L13 (100 pF)-L19 (700 pF), respectively) provided herein is characterized in that the differences in the common voltages obtained at different positions of the display panel are rather uniform.

From another perspective, at the same position shown in FIG. 12, the differences in the common voltages in the curves L20 (800 pF)-L24 (1200 pF) are each greater than the difference in the common voltages in the curve L12 (0 pF). This means that the compensation capacitors of the display panel for improving the uniformity of the common voltage of the display panel have the maximum capacitance. For instance, in contrast to the conventional display panel (not equipped with any compensation capacitor, as shown by the curve L1 (0 pF)), if each of the capacitances of the compensation capacitors of the display panel (as shown by the curves L20 (800 pF)-L24 (100 pF), respectively) provided herein is greater than 700 pF, the differences of the common voltages obtained at different positions of the display panel described herein are greater than those obtained at different positions of the conventional display panel. Hence, the capacitance of each of the compensation capacitors Cc1-Ccn in the display panel provided herein is greater than or at least equal to 10 pF, preferably from 10 pF to 700 pF.

To sum up, the compensation capacitors are arranged in the non-display area between the driving circuit area and the display area of the display panel described herein. The additional capacitors in the display panel are able to prevent the signal voltage of the scan lines or the data lines from significantly affecting the common voltage of the display panel, and the uniformity of the common voltage of the display panel can be satisfactory. The uniformity of the common voltage lessens the flicker in the images displayed on the display panel, and the display performance of the display panel is also improved.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A display panel having a display area and a non-display area surrounding the display area, the display panel comprising:
    a plurality of scan lines and a plurality of data lines, the scan lines and the data lines extending to the display area from the non-display area;
    a plurality of pixel structures located in the display area and electrically connected to the scan lines and the data lines, wherein each of the pixel structures comprises an active device and a pixel electrode electrically connected to the active device;
    at least one driving device located in the non-display area and electrically connected to the pixel structures;
    a plurality of capacitor electrode lines extending to the display area from the non-display area; and
    a plurality of compensation capacitors located in the non-display area and between the pixel structures and the at least one driving device, wherein one end of each of the compensation capacitors is electrically connected to one of the scan lines, and the other end of each of the compensation capacitors is electrically connected to one of the capacitor electrode lines,
    wherein the scan lines and the capacitor electrode lines are in one film layer, each of the compensation capacitors is overlapped with a respective one of one of the scan lines or one of the capacitor electrode lines along a stacking direction of the data lines and the scan lines, each of the compensation capacitors comprises a first electrode and a second electrode, the first electrode and the second electrode are overlapped to generate a capacitor, and the first electrode is electrically connected to one of the scan lines or one of the capacitor electrode lines through a contact window.

2. The display panel of claim 1, wherein a capacitance of each of the compensation capacitors is greater than or at least equal to 10 pF and is smaller than or equal to 700 pF.

3. The display panel of claim 1, further comprising a voltage input pad electrically connected to the capacitor electrode lines, wherein
the at least one driving device is located in the non-display area on one side of the display area and is electrically connected to the scan lines,
the voltage input pad and the at least one driving device are located in the non-display area on the one side of the display area, and
the compensation capacitors are arranged between the display area and the at least one driving device.

4. The display panel of claim 1, further comprising a plurality of voltage input pads electrically connected to the capacitor electrode lines, wherein
the at least one driving device comprises a first driving device and a second driving device respectively located in the non-display area on two opposite sides of the display area, such that the first driving device and the second driving device are electrically connected to the scan lines, respectively,
the voltage input pads are respectively located in the non-display area on the two opposite sides of the display area, and
the compensation capacitors are respectively arranged between the display area and the first driving device and between the display area ad the second driving device.

5. The display panel of claim 1, further comprising a voltage input pad electrically connected to the capacitor electrode lines, wherein
the at least one driving device is located in the non-display area on one side of the display area,
the voltage input pad is located in the non-display area on the other side of the display area, and
the compensation capacitors are arranged between the display area and the at least one driving device.

6. The display panel of claim 1, wherein the second electrode is constituted by one portion of one of the capacitor electrode lines, and the first electrode is electrically connected to one of the scan lines through a contact window.

7. The display panel of claim 6, wherein the first electrode and the data lines are in one film layer.

8. The display panel of claim 1, wherein the second electrode is constituted by one portion of one of the scan lines, and the first electrode is electrically connected to one of the capacitor electrode lines through a contact window.

9. The display panel of claim 8, wherein the first electrode and the data lines are in one film layer.

10. The display panel of claim 1, wherein each of the pixel structures further has a storage capacitor comprising a first capacitor electrode and a second capacitor electrode, the first capacitor electrode is connected to one of the capacitor electrode lines, and the second capacitor electrode is electrically connected to the active device of the each of the pixel structures.

* * * * *